(12) United States Patent
Lim et al.

(10) Patent No.: US 12,052,032 B2
(45) Date of Patent: Jul. 30, 2024

(54) ERROR CORRECTION USING PAM4 MODULATION

(71) Applicant: SAMSUNG ELECTRONICS CO., LTD., Suwon-si (KR)

(72) Inventors: Jinsoo Lim, Suwon-si (KR); Changkyu Seol, Suwon-si (KR); Myoungbo Kwak, Suwon-si (KR); Pilsang Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/055,867

(22) Filed: Nov. 16, 2022

(65) Prior Publication Data
US 2023/0396268 A1 Dec. 7, 2023

(30) Foreign Application Priority Data
Jun. 3, 2022 (KR) .......................... 10-2022-0068369

(51) Int. Cl.
*H03M 13/00* (2006.01)
*H03M 13/09* (2006.01)
*H03M 13/11* (2006.01)
*H03M 13/45* (2006.01)

(52) U.S. Cl.
CPC ....... *H03M 13/09* (2013.01); *H03M 13/1125* (2013.01); *H03M 13/45* (2013.01)

(58) Field of Classification Search
None
See application file for complete search history.

(56) References Cited

U.S. PATENT DOCUMENTS

| 10,164,660 | B1   | 12/2018 | Finn et al. |
| 11,082,067 | B1 * | 8/2021  | Ruan ........................ G06F 1/03 |
| 11,194,658 | B2   | 12/2021 | Nogami et al. |
| 11,424,859 | B2 * | 8/2022  | Brueggen ............. H04L 1/0045 |

(Continued)

FOREIGN PATENT DOCUMENTS

| EP | 1926102       | 5/2008 |
| KR | 10-2009-0084653 | 8/2009 |

(Continued)

OTHER PUBLICATIONS

Sharma, Debendra Das, "A low latency approach to delivering alternate protocols with coherency and memory semantics using PCI Express 6.0 PHY at 64.0 GT/s", 2021 IEEE Symposium on High-Performance Interconnects (HOTI).

(Continued)

*Primary Examiner* — Mujtaba M Chaudry
(74) *Attorney, Agent, or Firm* — F. Chau & Associates, LLC

(57) ABSTRACT

Disclosed is an electronic device, which includes an ECC decoder that performs ECC decoding on a flit including a plurality of PAM-4 symbols for each of a plurality of ECC groups, a CRC decoder that performs CRC decoding on the ECC decoded flit to obtain data, and an erasure decoding unit that calculates an LLR for each of the PAM-4 symbols when the CRC decoding fails, extracts an error symbol candidate from among the plurality of PAM-4 symbols for each of the plurality of ECC groups based on the LLR, and performs the ECC decoding again after erasing the error symbol candidate.

20 Claims, 13 Drawing Sheets

(56) References Cited

U.S. PATENT DOCUMENTS

| | | | |
|---|---|---|---|
| 11,789,818 B2* | 10/2023 | Schaefer | H03M 13/2906 |
| | | | 714/755 |
| 2021/0050941 A1* | 2/2021 | Das Sharma | G06F 11/1004 |
| 2021/0089418 A1* | 3/2021 | Das Sharma | G06F 11/2247 |
| 2021/0219033 A1* | 7/2021 | Lefevre | H04L 1/0042 |
| 2021/0311824 A1 | 10/2021 | Fackenthal et al. | |
| 2021/0376955 A1 | 12/2021 | Coulombe et al. | |
| 2022/0123860 A1* | 4/2022 | Brueggen | H04L 1/0061 |

FOREIGN PATENT DOCUMENTS

| | | |
|---|---|---|
| KR | 10-2020-0137184 | 12/2020 |
| KR | 10-2021-0150966 | 12/2021 |

OTHER PUBLICATIONS

D'Aria, Giovanna, "Reed-Solomon Error and Erasure Correction for PAM/FM Mobile Radio Systems", Proc. 38th IEEE Vehicular Technology Conference, Jun. 15, 1988 (Jun. 15, 1998) pp. 485-488, XP010077631.

Taipale, Dana J., et al., "An Improvement to Generalized-Minimum-Distance Decoding", IEEE Transactions on Information Theory 37 (1991) January, No. 1, New York, US.

EPO Search Report dated Jul. 7, 2023 from the EPO in corresponding EP Patent Application No. 23158435.0.

PCI Express Base Specification Revision 6.0 Version 0.9 (Draft) PCI-SIG Draft Spec Sep. 28, 2021.

* cited by examiner

FIG. 3

| Description | | Lane | | | |
|---|---|---|---|---|---|
| | | 0 | 1 | 2 | 3 |
| 512 UI | TLP Bytes [0 ... 235] | 0 | 1 | 2 | 3 |
| | | 4 | 5 | 6 | 7 |
| | | 8 | 9 | 10 | 11 |
| | | ... | ... | ... | ... |
| | | 224 | 225 | 226 | 227 |
| | | 228 | 229 | 230 | 231 |
| | | 232 | 233 | 234 | 235 |
| | DLP, CRC, ECC Bytes | DLP 0 | DLP 1 | DLP 2 | DLP 3 |
| | | DLP 4 | DLP 5 | CRC 0 | CRC 1 |
| | | CRC 2 | CRC 3 | CRC 4 | CRC 5 |
| | | CRC 6 | CRC 7 | ECC 0A | ECC 0B |
| | | ECC 0C | ECC 1A | ECC 1B | ECC 1C |

FIG. 4

| UI | 0 | 1 | 2 | 3 | ... | 252 | 253 | 254 | 255 |
|---|---|---|---|---|---|---|---|---|---|
| Lane | S1S0 | S3S2 | S5S4 | S7S6 | | S1S0 | S3S2 | S5S4 | S7S6 |
| | Symbol 0 | | | | | Symbol 252 | | | |

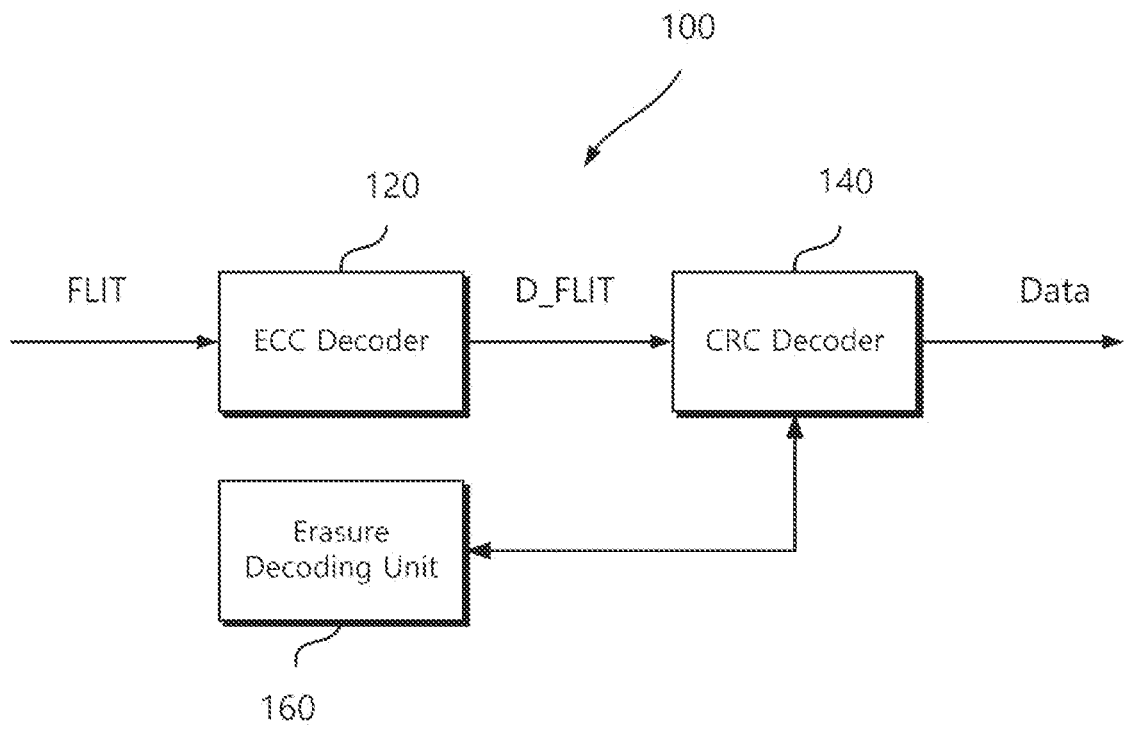

FIG. 6B

| ECC symbol | ... | e0 | e1 | e2 | e0 | e1 | e2 | e0 | e1 | e2 | e0 | e1 | ... |
|---|---|---|---|---|---|---|---|---|---|---|---|---|---|
| | | Cand 1 | | | Cand 2 | Cand 3 | | Cand 4 | | | Cand 5 | Cand 6 | |
| Index | ... | 41 | 42 | 43 | 44 | 45 | 46 | 47 | 48 | 49 | 50 | 51 | ... |
| Value | ... | 36 | 34 | 86 | 29 | 72 | 66 | 79 | 81 | 44 | 19 | 92 | ... |
| Iteration 1 | ... | 0 | 34 | 86 | 0 | 0 | 66 | 79 | 81 | 44 | 0 | 92 | ... |
| Iteration 2 | ... | 0 | 34 | 86 | 0 | 0 | 66 | 79 | 0 | 44 | 19 | 92 | ... |

FIG. 6C

| ECC symbol | ... | e0 | e1 | e2 | e0 | e1 | e2 | e0 | e1 | e2 | e0 | e1 | ... |
|---|---|---|---|---|---|---|---|---|---|---|---|---|---|
| | | Cand 1 | | | Cand 2 | Cand 3 | Cand 4 | Cand 5 | | Cand 6 | | Cand 7 | Cand 8 | |
| Index | ... | 41 | 42 | 43 | 44 | 45 | 46 | 47 | 48 | 49 | 50 | 51 | ... |
| Value | ... | 36 | 34 | 86 | 29 | 72 | 66 | 79 | 81 | 44 | 19 | 92 | ... |
| Iteration 1 | ... | 0 | 34 | 0 | 0 | 0 | 0 | 79 | 81 | 44 | 0 | 92 | ... |
| Iteration 2 | ... | 0 | 34 | 0 | 0 | 0 | 0 | 79 | 0 | 44 | 19 | 92 | ... |

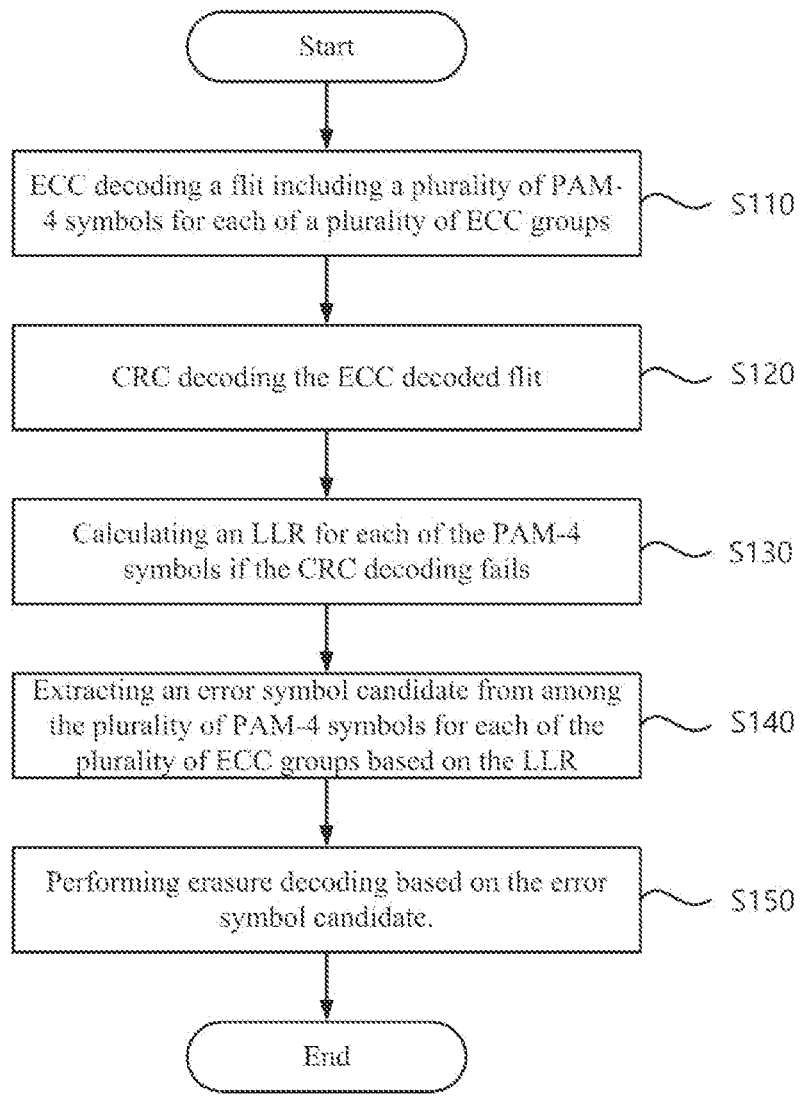

FIG. 10

| PAM-4 symbol | PAM_0 | PAM_1 | ... | PAM_(N-1) | PAM_(N) |
|---|---|---|---|---|---|
| LLR | Bit-LLR_0 | Bit-LLR_1 | Bit-LLR_2 | Bit-LLR_3 | Bit-LLR_4 | ... | Bit-LLR_(N-2) | Bit-LLR_(N-1) | Bit-LLR_(N) |
| Threshold | Threshold0 | Threshold0 | Threshold0 | Threshold0 | Threshold0 | ... | Threshold0 | Threshold0 | Threshold0 |
| LRB array | 1 | 0 | 0 | 0 | 0 | ... | 1 | 0 | 0 |
| LRS array | 1 | 0 | 0 | 0 | 1 | | | | |

ERROR CORRECTION USING PAM4 MODULATION

CROSS-REFERENCE TO RELATED APPLICATIONS

This U.S. non-provisional patent application claims priority under 35 U.S.C. § 119 to Korean Patent Application No. 10-2022-0068369 filed on Jun. 3, 2022, in the Korean Intellectual Property Office, the disclosure of which is incorporated by reference in its entirety herein.

1. TECHNICAL FIELD

Embodiments of the present disclosure relate to an electronic device having an error correction function and a method of operating the same.

2. DISCUSSION OF RELATED ART

Non-return-to-zero (NRZ) refers to a form a digital data transmission in which the binary low and high states are transmitted by specific and constant direct-current (DC) voltages. While NRZ supports a high Bit Error Rate (BER) such as $10^{-12}$, NRZ requires complex circuitry for transmission and reception. Pulse Amplitude Modulation-4 (PAM-4) is a multilevel signal modulation format, where each signal level represents 2 bits of logic information. While PAM-4 supports a lower BER, such as $10^{-6}$, PAM-4 does not require complex circuitry for transmission and reception. An Error Correction Code (ECC) may be used in Peripheral Component Interconnect Express (PCIe) to correct data encoded using PAM-4.

The ECC of the PCIe may be composed of a Reed-Solomon (RS) code in which one symbol has 8-bits, and is configured in a manner of concatenating three symbols and interleaving them. Since each RS code can correct only one symbol, three consecutive errors due to a burst error can be corrected, but there is a limit in that two errors occurring in one ECC cannot be corrected.

SUMMARY

At least one embodiment of the present disclosure provides an electronic device having an improved error correction function that can lower a Peripheral Component Interconnect Express (PCIe) retransmission rate by selecting symbols with high error probability and by performing erasure decoding, and a method of operating the same.

According to an embodiment of the present disclosure, an electronic device includes an ECC decoder that performs ECC decoding on a flit including a plurality of PAM-4 symbols to generate an ECC decoded flit for each of a plurality of ECC groups, a CRC decoder that performs CRC decoding on the ECC decoded flit to obtain data, and an erasure decoding unit that calculates an LLR for each of the PAM-4 symbols when the CRC decoding fails, extracts an error symbol candidate from among the plurality of PAM-4 symbols for each of the plurality of ECC groups based on the LLR, and performs the ECC decoding again after erasing the error symbol candidate.

According to an embodiment of the present disclosure, an electronic device includes a first circuit that generates a converted signal by performing an analog-to-digital conversion (ADC) and equalizing a PAM-4 signal received through a link, a second circuit that converts the converted signal into a flit including a plurality of PAM-4 symbols and performs ECC decoding and cyclic redundancy check (CRC) decoding on the flit for each of a plurality of ECC groups, and an erasure decoding unit that calculates an LLR for each of the PAM-4 symbols based on the converted signal when the CRC decoding fails, extracts an error symbol candidate from among the plurality of PAM-4 symbols for each of the plurality of ECC groups based on the LLR, and performs the ECC decoding again after erasing the error symbol candidate.

According to an embodiment of the present disclosure, a method of operating an electronic device includes performing ECC decoding on a flit including a plurality of PAM-4 symbols for each of a plurality of ECC groups, performing CRC decoding on the ECC decoded flit, calculating an LLR for each of the PAM-4 symbols when the CRC decoding fails, extracting an error symbol candidate from among the plurality of PAM-4 symbols for each of the plurality of ECC groups based on the LLR, and performing erasure decoding based on the error symbol candidate.

BRIEF DESCRIPTION OF THE FIGURES

A detailed description of each drawing is provided to facilitate a more thorough understanding of the drawings referenced in the detailed description of the present disclosure.

FIG. 3 is a diagram for describing a flit mode supported by a logical sub-block.

FIG. 4 is a diagram illustrating ECC symbols for each lane.

FIG. 5 is a diagram illustrating an electronic device, according to an embodiment of the present disclosure.

FIGS. 6A to 6C are diagrams for describing erasure decoding, according to various embodiments of the present disclosure.

FIG. 7 is a flowchart illustrating a method of operating an electronic device, according to an embodiment of the present disclosure.

FIG. 10 is a diagram for describing a generation of an LRS array.

DETAILED DESCRIPTION

Hereinafter, embodiments of the present disclosure will be described in detail and clearly to such an extent that one of ordinary skill in the art may implement the present disclosure.

Figure 1:
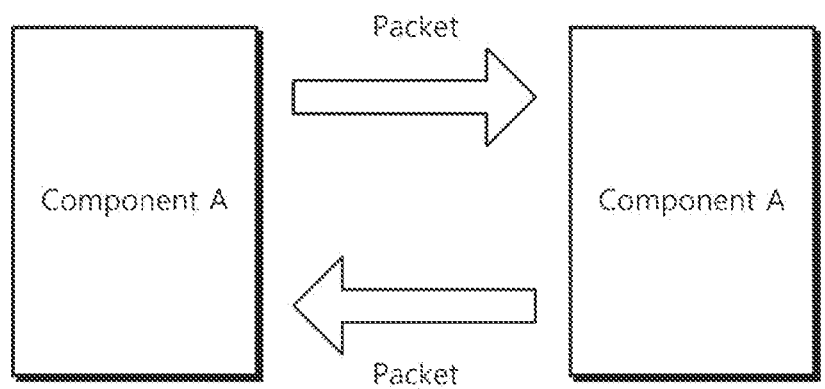
FIG. 1 is a diagram illustrating a PCIe link.

FIG. 1 is a diagram illustrating a PCIe link.

Referring to FIG. 1, a link may correspond to a dual-simplex communication channel between two components. The link includes a transmit pair and a receive pair, which are two differential drive signal pairs. A data clock signal used in the link may be embedded using an encoding scheme to achieve very high data rates. The link supports at least one lane. Each lane corresponds to a set of differential signal pairs. For bandwidth expansion, the link may aggregate a plurality of lanes. The lane included in the link may be represented by xN (where 'N' is a width of the lane), for example, lanes supported by the PCIe may be x1, x2, x4, x8, and x16. In a hardware initialization phase, the link is set according to the negotiation of the lane width and operating frequency by two agents at both ends of the link. Each link may support a symmetric number of lanes in each direction, for example, an x16 link may have 16 differential signal pairs in each direction.

Figure 2:
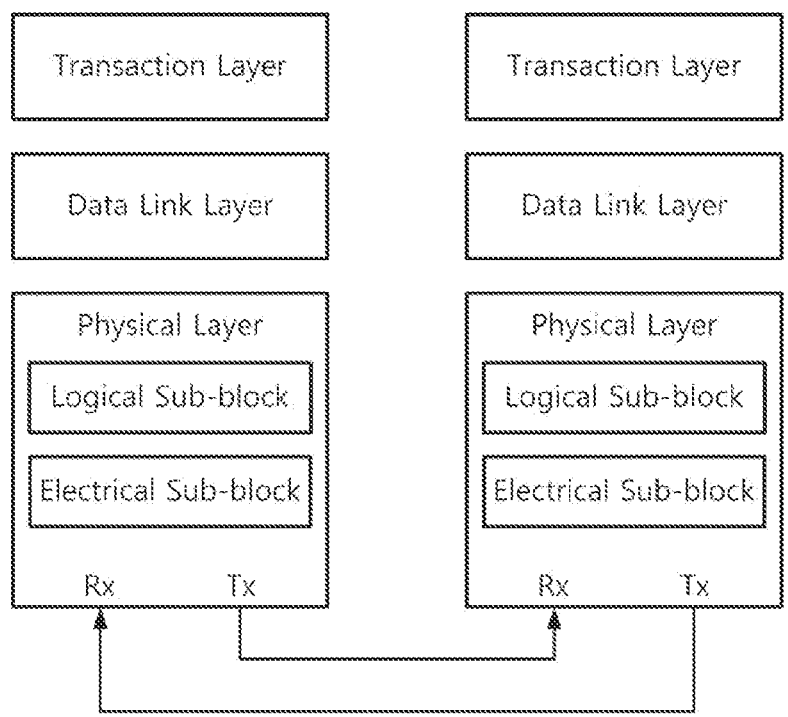
FIG. 2 illustrates a layer model of a PCIe.

FIG. 2 illustrates a layer model of a PCIe.

Referring to FIG. 2, the layer model of the PCIe includes a transaction layer, a data link layer, and a physical layer. Each layer includes a part that processes transmitted outbound information and a part that processes received inbound information.

Information between the two components is transferred to each other through a packet. The packet is formed in the transaction layer and the data link layer to transfer information from a transmitting component to a receiving component. When a transmitting packet passes through another layer, additional information needed to process the packet at that layer is expanded. On the receiving side, the reverse process occurs, and the packet is transferred to the transaction layer through the physical layer and the data link layer.

When each layer is described, the transaction layer is the uppermost layer and is responsible for assembly and disassembly of Transaction Layer Packets (TLP). The TLP is used for transactional communication such as reads and writes, as well as certain types of events. The transaction layer manages a credit-based flow control for the TLP. Request packets that require response packets may be implemented as split transactions. Each packet may have a unique identifier that allows the response packet to be sent to the correct component. The format of the packet may support different types of addressing depending on the type of memory, input/output (I/O), configuration, and message of the transaction. The transaction layer may support four address spaces. For example, three PCI address spaces for memory, I/O, and configuration may be included in the transaction layer, and an address space for the message may be added.

The data link layer, which is a middle layer, acts as an intermediate layer between the transaction layer and the physical layer. The data link layer is responsible for link management and data integrity, including error detection and error correction. The transmitting side of the data link layer receives a TLP generated by the transaction layer, calculates and incorporates a data protection code and a TLP sequence number into the TLP, and transfers the TLP to the physical layer for transmission over the link. The receiving side verifies the integrity of the received TLP and transfers it to the transaction layer for additional processing. When an error is detected in the TLP, the data link layer requests retransmission of the TLP until the information is correctly received or it is determined that the link has failed. The data link layer also generates and consumes packets used for link management functions. To distinguish a packet of the data link layer from a packet used in the transaction layer, the packet of the data link layer may be referred to as a Data Link Layer Packet (DLP or DLLP).

The physical layer, which is the lowest layer, may include circuitry for an interface operation, such as drivers, input buffers, parallel-to-serial (PS) and serial-to-parallel (SP) converters, phased-locked-loops (PLLs), and impedance matching circuits. The physical layer may also include circuits to perform logical functions related to interface initialization and maintenance. The physical layer exchanges information with the data link layer in an appropriate format. The physical layer converts information received from the data link layer into a serial format and transmits it over the link with a frequency and width compatible with other components.

The physical layer may include a logical sub-block and an electrical sub-block. In an embodiment, the logic sub-block is a first circuit and the electrical sub-block is a second other circuit. The physical layer may include a receiver Rx and a transmitter Tx.

The logical sub-block prepares outgoing information transferred from the data link layer to transmit it to the electrical sub-block, and identifies and prepares the received information before transferring information to the data link layer. The logical sub-block performs the control and management functions of the physical layer. The PCIe supports multiple encoding types and two data stream modes (flit mode and non-flit mode). The non-flit mode is defined as contiguous TLP, DLLP, and logical Idle/IDL (IDLe) tokens. The flit mode is defined as a set of flits, which are data units. In an embodiment, a flit is a flow control unit or a flow control digit, which is part of a network packet. For example, the first flit of a network packet may be referred to as a header flit that holds information about a route or destination of the packet. The first flit may be followed by zero or more flits that contain the actual payload of data being transmitted by the packet. The final flit, called the tail flit, may be used to perform some bookkeeping to close the connection between two components.

The electrical sub-block may support at least one of an NRZ signaling, a PAM-4 signaling, a reference clock architecture, a spread spectrum clock, a swing mode for low power link operation, an in-band receiver detection and electrical idle detection, channel compliance methodology, adaptive transmitter equalization and reference receiver equalization, lane margining and AC-coupled channel, etc. For example, the electrical sub-block may generate a converted signal which is a digital signal by performing analog-to-digital conversion (ADC) and equalizing the signal received for each lane included in the link, and may transfer the converted signal to the logical sub-block.

FIG. 3 is a diagram for describing a flit mode supported by a logical sub-block.

Referring to FIG. 3, the flit includes the TLP, the DLP, the CRC, and the ECC, as data units supported in the flit mode. For example, the flit may have a size of 256 Bytes (B), that is, 2048-bits, and in this case, may include the TLP of 236 B, the DLP of 6 B, the CRC of 8 B, and the ECC of 6 B. In an embodiment, the flit is interleaved with respect to a plurality of lanes through a byte alignment method. For example, the flit may be interleaved in a 3-way manner. The interleaved flit includes a plurality of ECC symbols (or ECC codewords), and the plurality of ECC symbols belong to any one of a plurality of ECC groups. For example, in the case of interleaving in the 3-way manner, the number of ECC groups is three. Each of the plurality of ECC symbols has a size of 8-bits. ECC codes belonging to each ECC group may correct errors occurring in each ECC group. When a size of the flit is 256 B, and when the flits are interleaved in a 3-way manner, one of the plurality of ECC groups includes 86 B ECC symbols, and the remaining ECC groups each include 85 B ECC symbols.

As illustrated, the ECC symbols are classified into a symbol corresponding to the TLP, a symbol corresponding to the DLP, a symbol corresponding to the CRC, and a symbol corresponding to the ECC. In this case, the symbol corresponding to the ECC is a symbol including RS code information in the ECC symbol generated as a result of ECC encoding. In the case of the symbol corresponding to the CRC, one ECC group may include three symbols, and the remaining ECC groups may include two symbols.

FIG. 4 is a diagram illustrating ECC symbols for each lane.

Referring to FIG. 4, interleaved ECC symbols are arranged for each lane. Since PAM-4 signaling is applied in the flit mode, each ECC symbol includes a plurality of PAM-4 symbols for PAM-4 signaling. Accordingly, the flit may be understood as including a plurality of PAM-4 symbols. The PAM-4 symbols are arranged at every 2-bit aligned boundary, and each PAM-4 symbol has a size of 2-bits. For example, when the ECC symbol has a size of 8-bits as illustrated, each ECC symbol includes 4 PAM-4 symbols.

Hereinafter, various embodiments of an electronic device 100 having improved correction capability with respect to errors occurring in the aforementioned flit will be described. The electronic device 100 may be referred to as a PCIe device or a receiver, and may correspond to a physical layer included in the PCIe layer.

FIG. 5 is a diagram illustrating an electronic device, according to an embodiment of the present disclosure.

Referring to FIG. 5, the electronic device 100 according to an embodiment of the present disclosure includes an ECC decoder 120 (e.g., a logic circuit), a CRC decoder 140 (e.g., a logic circuit), and an erasure decoding unit 160 (e.g., logic circuit).

The ECC decoder 120 performs ECC decoding on a flit including a plurality of PAM-4 symbols for each of a plurality of ECC groups. For example, the ECC decoder 120 may perform ECC decoding on an RS code including a row parity and check bits generated by a parity check matrix (PCM) during the ECC encoding. The PCM, the row parity and the check bits may be generated by the ECC encoding at the transmitting side.

For example, the PCM may be defined as follows.

$$H = \begin{vmatrix} 1 & 1 & \ldots & 1 & 0 & 1 \\ \alpha^{N-1} & \alpha^{N-2} & \ldots & \alpha & 1 & 0 \end{vmatrix} \begin{matrix} \text{Row Parity} \\ \text{Check Bits} \end{matrix}$$

Here, 'H' is the PCM, 'α' is an element defined in a $2^8$ Galois field (GF) space, and 'N' is the number of symbols in any one ECC group. Each row of the PCM is used to generate the row parity and the check bits.

The row parity may be defined as follows.

$$P = \sum_{i=0}^{83} B_i$$

Here, 'P' is row parity, and '$B_i$' is a symbol corresponding to the TLP, the DLP, and the CRC among the ECC symbols. That is, the row parity is generated through a bit-wise XOR operation of $B_i$ symbols.

The check bit may be defined as follows.

$$C = \sum_{i=0}^{83} B_i \times \alpha^{(84-i)}$$

Here, 'C' is the check bit. That is, the check bit is generated through the bit-wise XOR operation of a value obtained by multiplying $B_i$ symbols by the 'α', similar to the CRC generation.

For example, generation of the row parity and the check bits to be used when performing ECC encoding on the ECC group of 86 B may be defined as follows.

$$\begin{bmatrix} 1 & 1 & 1 & & 1 & 1 & 1 \\ \alpha^{83} & \alpha^{82} & \alpha^{81} & \ldots & \alpha^2 & \alpha^1 & \alpha \end{bmatrix} B = \begin{bmatrix} P \\ C \end{bmatrix}$$

The transmitting side performs the ECC encoding based on the row parity and the check bits to generate an ECC-encoded signal, and transmits the ECC-encoded signal. The ECC decoder 120 performs ECC decoding based on an RS code included in the ECC-encoded signal, that is, the row parity and the check bits to generate an ECC decoded flit D_FLIT, and transmits the ECC decoded flit D_FLIT to the CRC decoder 140. In the RS code, one error can be corrected within one ECC group when the position of the error is unknown, and up to two errors can be corrected when the position of the error is known.

The CRC decoder 140 performs CRC decoding on the ECC decoded flit D_FLIT to obtain data. In this case, the data may be the TLP and the DLP. The CRC decoder 140 performs CRC decoding on the entire flit (e.g., the remaining ECC symbols excluding symbols corresponding to the ECC) regardless of the ECC group, based on the symbol corresponding to the CRC included in the flit.

In an embodiment, when the CRC decoding fails, the CRC decoder 140 performs the CRC decoding again after the ECC decoding is re-performed by the erasure decoding unit 160. The CRC decoder 140 may request the transmission side to retransmit the flit when the re-performing of the CRC decoding fails.

In an embodiment, the erasure decoding unit 160 performs erasure decoding when the CRC decoding performed by the CRC decoder 140 fails. In an embodiment, the erasure decoding includes calculating a log likelihood ratio (LLR) for each PAM-4 symbol, selecting a symbol with a high error occurrence probability among the ECC symbols included in the flit based on the LLR, and performing the ECC decoding again while randomly extracting and erasing at least two of the selected symbols. In this case, the erasing means processing the codeword of the corresponding symbol as '0'.

According to an embodiment, when flits are interleaved with respect to three ECC groups, and when an error occurs in two symbols for each at least one ECC group, the erasure decoding unit 160 performs the erasure decoding when the CRC decoding of the CRC decoder 140 fails.

FIGS. 6A to 6C are diagrams for describing erasure decoding, according to various embodiments of the present disclosure.

Referring to FIG. 6A, according to an embodiment, when an error occurs in two symbols in one ECC group among a plurality of ECC groups, erasure decoding may be performed. When CRC decoding fails in the CRC decoder 140, the erasure decoding unit 160 extracts error symbol candidates corresponding to a preset number of candidates 'numErasure' (three in the case of FIG. 6A) among ECC symbols. The error symbol candidates are extracted so as to include symbols in which the error actually occurs. For example, when an error actually occurs in a candidate 1 'Cand 1' and a candidate 2 'Cand 2' in FIG. 6A, the erasure decoding unit 160 may extract the candidate 1 'Cand 1', the candidate 2 'Cand 2', and a candidate 3 'Cand 3', which is a symbol having a high error occurrence probability among the remaining symbols, as the error symbol candidates. The candidate 1 'Cand 1' to the candidate 3 'Cand 3' have indices corresponding to 45, 48, and 51, respectively. The erasure decoding unit 160 arbitrarily or randomly extracts two candidates from among the candidate 1 'Cand 1' to the candidate 3 'Cand 3', and performs erasing and ECC decoding. The erasing means setting the codeword value of the symbol corresponding to each index to '0'. For example, when the candidate 1 'Cand 1' and the candidate 3 'Cand 3' are extracted among the candidate 1 'Cand 1' to the candidate 3 'Cand 3' in the first attempt, the erasure decoding unit 160 performs the ECC decoding again after setting the codeword value of corresponding candidate to '0'. Since the symbols in which the error actually occurs are the candidate 1 'Cand 1' and the candidate 2 'Cand 2', the first attempt fails. When the candidate 1 'Cand 1' and the candidate 2 'Cand 2' are extracted in the second attempt, the erasure decoding unit 160 sets the codeword value of the corresponding candidates to '0' and then performs the ECC decoding again. Since the candidates in which the error actually occurs are extracted, the ECC decoding is successful and the erasure decoding is terminated.

Referring to FIG. 6B, according to an embodiment, when an error occurs in two symbols in each of two ECC groups among the plurality of ECC groups, the erasure decoding may be performed. When the CRC decoding fails in the CRC decoder 140, the erasure decoding unit 160 extracts error symbol candidates corresponding to a preset number of candidates 'numErasure' (six in the case of FIG. 6B) among ECC symbols. The error symbol candidates are extracted so as to include symbols in which the error actually occurs. For example, when an error actually occurs in the candidate 1 'Cand 1' to a candidate 4 'Cand 4' in FIG. 6B, the erasure decoding unit 160 may extract the candidate 1 'Cand 1' to the candidate 4 'Cand 4', and a candidate 5 'Cand 5' and a candidate 6 'Cand 6', which are symbols having a high error occurrence probability among the remaining symbols, as the error symbol candidates. The candidate 1 'Cand 1' to the candidate 6 'Cand 6' have indices corresponding to 41, 44, 45, 48, 50, and 51, respectively. The erasure decoding unit 160 arbitrarily or randomly extracts four candidates from among the candidate 1 'Cand 1' to the candidate 6 'Cand 6', and performs the erasing and the ECC decoding. For example, when the candidate 1 'Cand 1' to the candidate 3 'Cand 3', and the candidate 5 'Cand 5' are extracted among the candidate 1 'Cand 1' to the candidate 6 'Cand 6' in the first attempt, the erasure decoding unit 160 set the codeword value of the corresponding candidates to '0', and then performs the ECC decoding again. In this case, the first attempt fails. When the candidate 1 'Cand 1' to the candidate 4 'Cand 4' are extracted in the second attempt, the erasure decoding unit 160 sets the codeword value of the corresponding candidates to '0' and then performs the ECC decoding again. Since the candidates in which the error actually occurs are extracted, the ECC decoding is successful and the erasure decoding is terminated.

Referring to FIG. 6C, according to an embodiment, when an error occurs in two symbols in each of three ECC groups among the plurality of ECC groups, the erasure decoding may be performed. When the CRC decoding fails in the CRC decoder 140, the erasure decoding unit 160 extracts error symbol candidates corresponding to a preset number of candidates 'numErasure' (eight in the case of FIG. 6C) among ECC symbols. The error symbol candidates are extracted so as to include symbols in which the error actually occurs. For example, when an error actually occurs in the candidate 1 'Cand 1' to the candidate 6 'Cand 6' in FIG. 6C, the erasure decoding unit 160 may extract the candidate 1 'Cand 1' to the candidate 6 'Cand 6', and a candidate 7 'Cand 7' and a candidate 8 'Cand 8', which are symbols having a high error occurrence probability among the remaining symbols, as the error symbol candidates. The candidate 1 'Cand 1' to the candidate 8 'Cand 8' have indices corresponding to 41, 43, 44, 45, 46, 48, 50, and 51, respectively. The erasure decoding unit 160 arbitrarily or randomly extracts six candidates from among the candidate 1 'Cand 1' to the candidate 8 'Cand 8', and performs the erasing and the ECC decoding. For example, when the candidate 1 'Cand 1' to the candidate 5 'Cand 5', and the candidate 7 'Cand 7' are extracted among the candidate 1 'Cand 1' to the candidate 8 'Cand 8' in the first attempt, the erasure decoding unit 160 sets the codeword value of the corresponding candidates to '0', and then performs the ECC decoding again. In this case, the first attempt fails. When the candidate 1 'Cand 1' to the candidate 6 'Cand 6' are extracted in the second attempt, the erasure decoding unit 160 sets the codeword value of the corresponding candidates to '0' and then performs the ECC decoding again. Since the candidates in which the error actually occurs are extracted, the ECC decoding is successful and the erasure decoding is terminated.

FIG. 7 is a flowchart of a method of operating an electronic device, according to an embodiment of the present disclosure. Detailed descriptions of parts overlapping with the above description will be omitted to avoid redundancy.

Referring to FIG. 7, in operation S110, the electronic device 100 performs ECC decoding on a flit including a plurality of PAM-4 symbols for each of a plurality of ECC groups. The ECC decoding may generate an ECC decoded flit D_FLIT.

In operation S120, the electronic device 100 performs CRC decoding on the ECC decoded flit D_FLIT. When the CRC decoding is successful, the operation method ends, and when the CRC decoding fails, the procedure proceeds to operation S130.

In operation S130, when the CRC decoding fails, the electronic device 100 calculates the LLR for each of the PAM-4 symbols. Operation S130 is performed with respect to 2-bits included in all PAM-4 symbols.

In operation S140, the electronic device 100 extracts an error symbol candidate from among the plurality of PAM-4 symbols for each of the plurality of ECC groups based on the LLR. For example, the extraction may include extracting one or more error symbol candidates based on the LLRs.

In operation S150, the electronic device 100 performs the erasure decoding based on the error symbol candidate. Operation S150 may include erasing the error symbol candidate and re-performing ECC decoding. The erasure decoding may be performed on one or more error symbol candidates and the erasing may set each error symbol candidate to 0.

According to the above-described electronic device 100 and an operating method thereof according to various embodiments of the present disclosure, when an error occurs in two ECC symbols in at least one ECC group among ECC symbols included in a flit received through a link, an improved error correction capability may be achieved by extracting a symbol with a high error occurrence probability as an error symbol candidate and performing the erasure decoding based on the error symbol candidate. In the conventional case, when the CRC decoding fails, since a flit retransmission is requested immediately, the system bandwidth is lowered, and performance is deteriorated. In contrast, in the case of the present disclosure, it is possible to reduce the retransmission request by performing the erasure decoding on an error symbol candidate after the CRC decoding fails.

Hereinafter, the erasure decoding unit 160 included in the electronic device 100 will be described in more detail.

Figure 8:
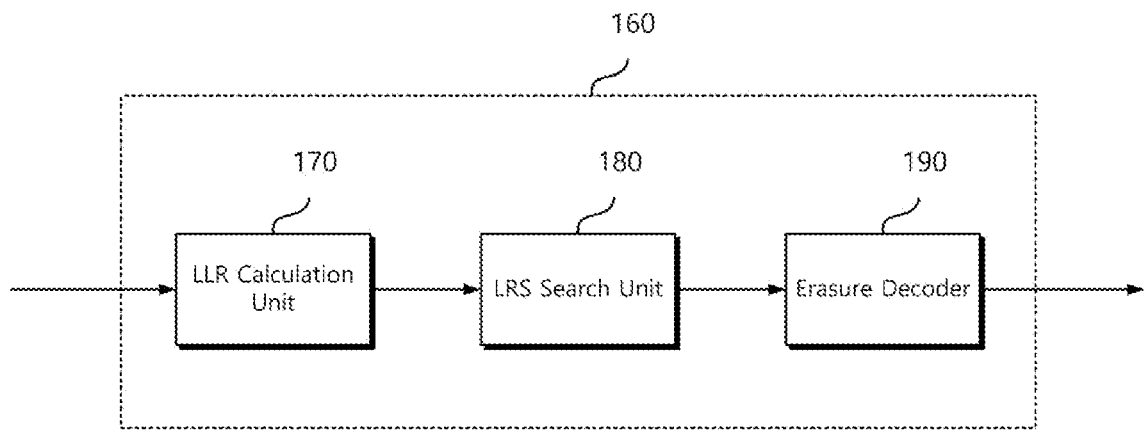
FIG. 8 is a diagram illustrating an erasure decoding unit, according to an embodiment of the present disclosure.

FIG. 8 is a diagram illustrating an erasure decoding unit, according to an embodiment of the present disclosure.

Referring to FIG. 8, the erasure decoding unit 160 includes an LLR calculation unit 170 (e.g., a logic circuit) that calculates an LLR for each of PAM-4 symbols, a least reliable symbol (LRS) search unit 180 (e.g., a logic circuit) that extracts an error symbol candidate from among a plurality of PAM-4 symbols for each of a plurality of ECC groups based on the LLR, and an erasure decoder 190 (e.g., a logic circuit) that performs the ECC decoding again after erasing the error symbol candidate.

The LLR calculation unit 170 calculates the LLR for each 2-bits included in the PAM-4 symbols. In an embodiment, the LLR calculation unit 170 calculates the LLR in units of bits based on a converted signal obtained by performing an analog-to-digital conversion and equalizing the PAM-4 signal. For example, the equalizing may be performed when the PAM-4 signal includes noise (e.g., an AWGN (Additive White Gaussian Noise), etc.) as transmitted from the transmitting side. For example, since the PAM-4 symbol has 2-bits corresponding to 4-levels, two LLRs may be calculated with respect to one PAM-4 symbol.

The LRS search unit 180 compares the LLR with a preset threshold value in units of bits, and extracts an error symbol candidate depending on the comparison result. The LRS search unit 180 generates an LRS array corresponding to position information of the error symbol candidate based on the extracted error symbol candidate. The LRS array refers to an array capable of specifying the positions of symbols with a high error occurrence probability. A detailed description of the LRS search unit 180 will be described later.

The erasure decoder 190 performs ECC decoding again after erasing the error symbol candidate based on the LRS array. The erasure decoder 190 may specify a position of an error symbol candidate among ECC symbols based on the LRS array, and may perform erasure processing of the corresponding position. As described above, the erasure decoder 190 may randomly extract at least two error symbol candidates from among error symbol candidates, and may perform the ECC decoding again after erasing the extracted at least two error symbol candidates. The number 'numCand' of error symbol candidates arbitrarily or randomly extracted for erasure processing may be set differently according to the number of symbols in which an error actually occurs.

According to an embodiment, the erasure decoder 190 performs erasure processing and ECC decoding re-performing with respect to all extractable combinations of error symbol candidates. For example, when the number of symbols in which an error actually occurs is two and the number 'numCand' of error symbol candidates is three, the erasure decoder 190 may perform the erasure decoding with respect to a combination of error symbol candidates that can be represented by $_3C_2$. The erasure decoder 190 performs the erasure decoding with at least one attempt on the combination of error symbol candidates, and when the ECC decoding succeeds during an attempt, terminates the erasure decoding. Alternatively, the erasure decoder 190 terminates the erasure decoding even if the ECC decoding fails for all combinations of error symbol candidates.

Figure 9:
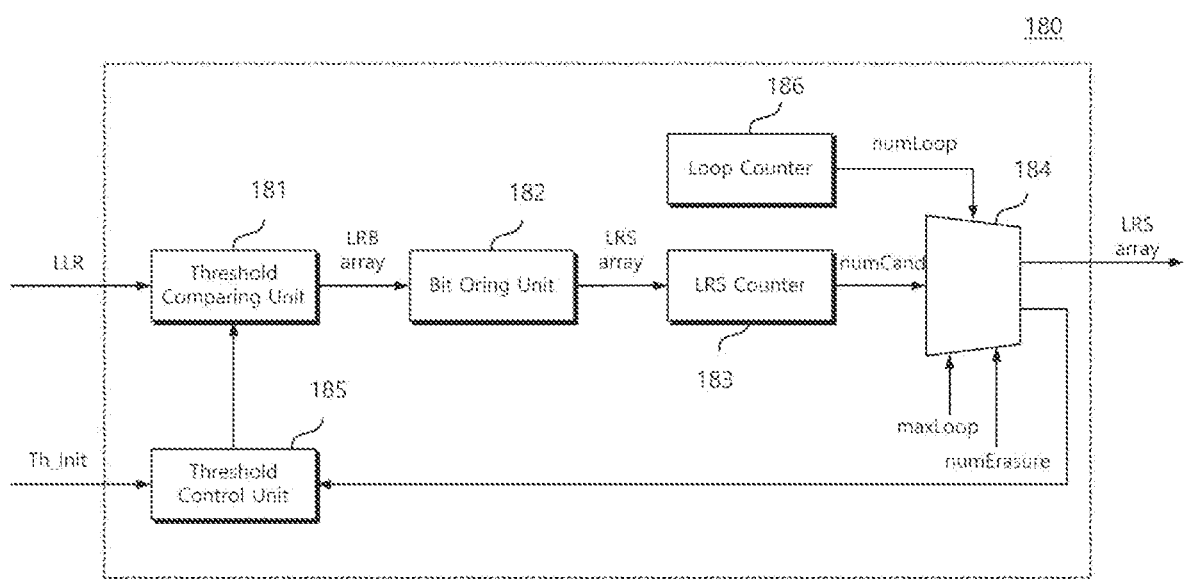
FIG. 9 is a diagram illustrating an LRS search unit, according to an embodiment of the present disclosure.

FIG. 9 is a diagram illustrating an LRS search unit, according to an embodiment of the present disclosure.

Referring to FIG. 9, the LRS search unit 180 includes a threshold comparing unit 181 (e.g., a logic circuit), a bit ORing unit 182 (e.g., logic circuit), an LRS counter 183 (e.g., a counter circuit), a comparing unit 184 (e.g., a comparator), a threshold control unit 185 (e.g., a logic circuit), and a loop counter 186 (e.g., a counter circuit).

The threshold comparing unit 181 compares the LLR with a preset threshold value, and binarizes a bit having the LLR less than the preset threshold value and a bit having the LLR greater than or equal to the preset threshold value in the flit to generate a least reliable bit (LRB) array. For example, a bit may be set to 1 when the LLR is less than the preset threshold and set to 0 when the LLR is greater than or equal to the preset threshold value, for storage in the LRB array. For example, when the flit has a size of 2048-bits, the threshold comparing unit 181 compares each of the 2048-bits with the preset threshold value and generates the LRB array corresponding to each bit.

According to an embodiment, the threshold comparing unit 181 converts a bit having the LLR less than the preset threshold value to have a logic '1', and converts a bit having the LLR equal to or greater than the preset threshold value to have a logic '0'.

According to an embodiment, among bits included in the LRB array, a bit determined to have a high error occurrence probability may have a logic '1', and a bit determined to have a low error occurrence probability may have a logic '0', according to the comparison of the LLR with the preset threshold value.

The bit ORing unit 182 converts the LRB array into ECC symbol units to generate the LRS array. In an embodiment, the LRB array has 2048-bits equal to the bit size of the flit, and is converted by the bit ORing unit 182 into units of symbols for every 8-bit unit that is the size of the ECC symbol. For example, the bit ORing unit 182 converts 8-bits into ECC symbols by performing an OR operation in units of 8-bits. By the OR operation, when any one of the 8-bits included in the LRB array has a logic of '1', a corresponding symbol unit has a logic of '1'. Accordingly, the LRS array has a symbol unit corresponding to each ECC symbol, and each symbol unit specifies a position of an ECC symbol having a high error occurrence probability according to a logical value, that is, a position of an error symbol candidate.

The LRS counter 183 counts the number 'numCand' of error symbol candidates from the LRS array generated by the bit ORing unit 182. For example, the LRS counter 183 may count the number of symbols having a logic of '1' among symbols included in the LRS array as the number 'numCand' of error symbol candidates.

The comparing unit 184 compares the number 'numCand' of error symbol candidates counted from the LRS counter 183 with the preset number 'numErasure' of candidates, and when the number 'numCand' of error symbol candidates is the same as the preset number 'numErasure' of candidates, the comparing unit 184 outputs the LRS array to the erasure decoder 190.

The threshold control unit 185 adjusts the preset threshold value when the number 'numCand' of error symbol candidates is different from the preset number 'numErasure' of candidates, according to the comparison result of the comparing unit 184. For example, when the number 'numCand' of error symbol candidates is less than the preset number 'numErasure' of candidates, the threshold control unit 185 increases the preset threshold value from the currently set value. For example, when the number 'numCand' of error symbol candidates exceeds the preset number 'numErasure' of candidates, the threshold control unit 185 decreases the preset threshold value from the currently set value. The preset threshold may have an initial value Th_Init.

The loop counter 186 counts the number 'numLoop' of loops corresponding to the extraction operation of the error symbol candidate performed by the LRS search unit 180. For example, the loop counter 186 defines operations from the threshold value comparison and LRB operation by the threshold comparing unit 181 to the threshold value control operation by the threshold control unit 185 as one loop, and counts the number 'numLoop' of loops every time one loop ends. The loop counter 186 transmits the number 'numLoop' of loops to the comparing unit 184, and the comparing unit 184 iterates the operation of comparing the number 'numCand' of error symbol candidates with the preset number 'numErasure' of candidates. While iterating, when the number 'numLoop' of current loops reaches a preset number ' maxLoop' of loops, the loop ends. When the number 'numCand' of error symbol candidates does not match the preset number 'numErasure' of candidates when a preset number 'maxLoop' of loops is reached, the comparing unit 184 sends the LRS array corresponding to the number 'numCand' of error symbol candidates as it is.

FIG. 10 is a diagram for describing a generation of an LRS array.

Referring to FIG. 10, the LLR calculation unit 170 calculates the LLR for each PAM-4 symbol based on the converted signal obtained by converting the PAM-4 signal by the ADC and the equalizing. When the total number of bits included in the flit is $N_b$ and the number of PAM-4 symbols is $N_p$, since the size of the PAM-4 symbol is 2-bits, $2N_p=N_b$ is established. The LLR is calculated for every $N_b$.

The threshold comparing unit 181 compares the calculated LLR with the preset threshold value in units of bits, and generates the LRB array by binarizing the comparison result. As for the preset threshold, an initial value is applied in the first loop, which is commonly applied to all bits. Thereafter, when the threshold value is changed by the threshold control unit 185 as the loop progresses, the changed threshold value is commonly applied. The threshold comparing unit 181 generates the LRB array by applying a logic '1' to a bit that is less than the preset threshold value and a logic '0' to a bit that is greater than or equal to the preset threshold value, according to the comparison result.

The bit ORing unit 182 generates the LRS array by ORing the LRB array in units of 8-bits. The symbol having a logic '1' in the LRS array means that it is determined that at least one of 8-bits has a high error occurrence probability. Each symbol of the LRS array specifies the position of an error symbol candidate in the ECC symbol.

Hereinafter, an operation method of the LRS search unit 180 will be described.

Figure 11:
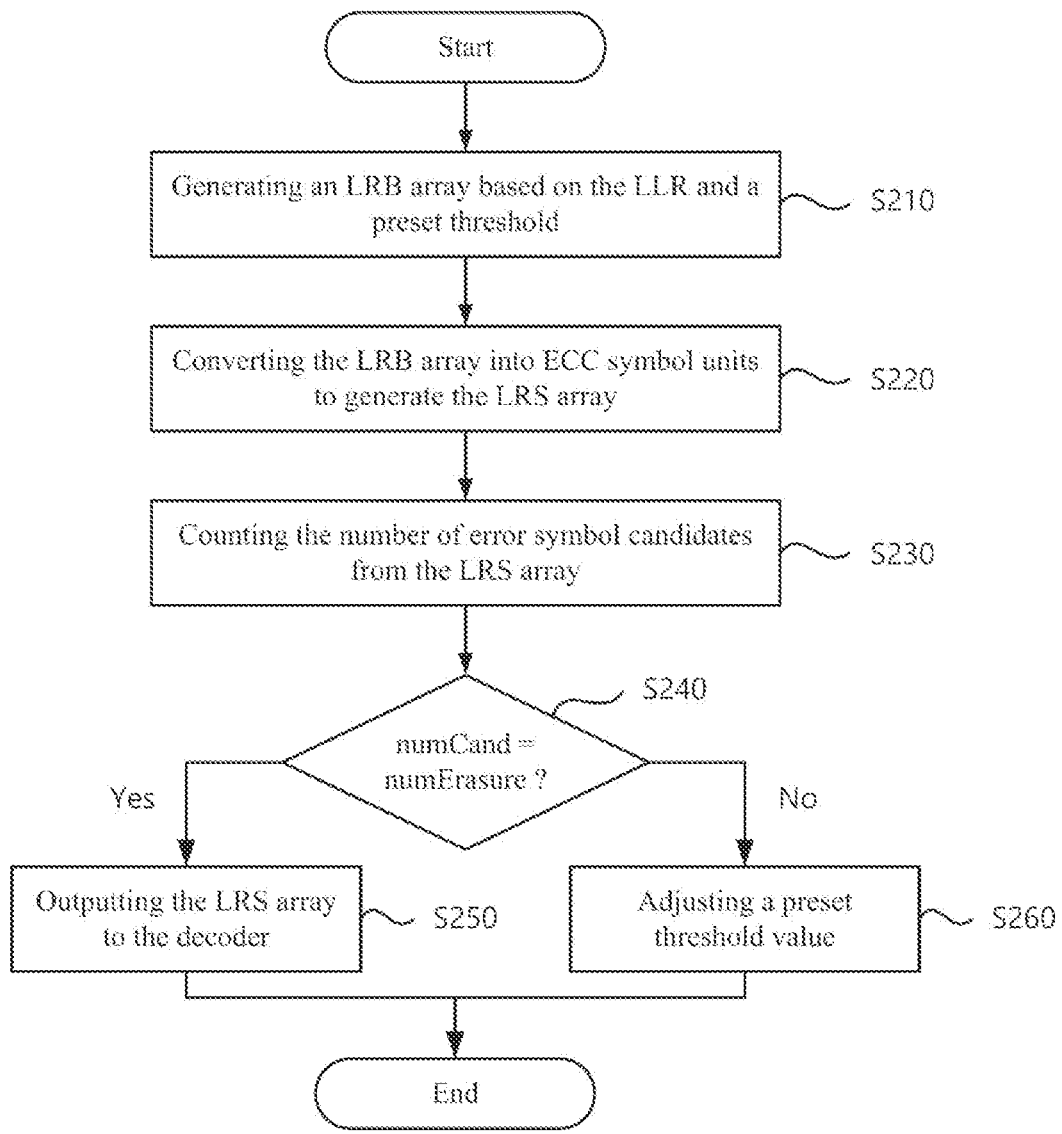
FIG. 11 is a flowchart illustrating a method of operating an LRS search unit.

FIG. 11 is a flowchart illustrating a method of operating an LRS search unit.

Referring to FIG. 11, in operation S210, the LRS search unit 180 generates an LRB array based on the LLR and a preset threshold value. For example, the LRS search unit 180 may generate the LRB array based on a plurality of LLRs generated from each of the symbols and how they compare to the preset threshold value.

In operation S220, the LRS search unit 180 converts the LRB array into ECC symbol units to generate the LRS array.

In operation S230, the LRS search unit 180 counts the number 'numCand' of error symbol candidates from the LRS array.

In operation S240, the LRS search unit 180 compares the number 'numCand' of error symbol candidates with the preset number 'numErasure' of candidates.

When it is determined that the number 'numCand' of error symbol candidates and the preset number 'numErasure' of candidates are the same according to operation S240, in operation S250, the LRS search unit 180 outputs the LRS array to the erasure decoder 190.

When it is determined that the number 'numCand' of error symbol candidates is different from the preset number 'numErasure' of candidates according to operation S240, in operation S260, the LRS search unit 180 adjusts a preset threshold value.

Figure 12:
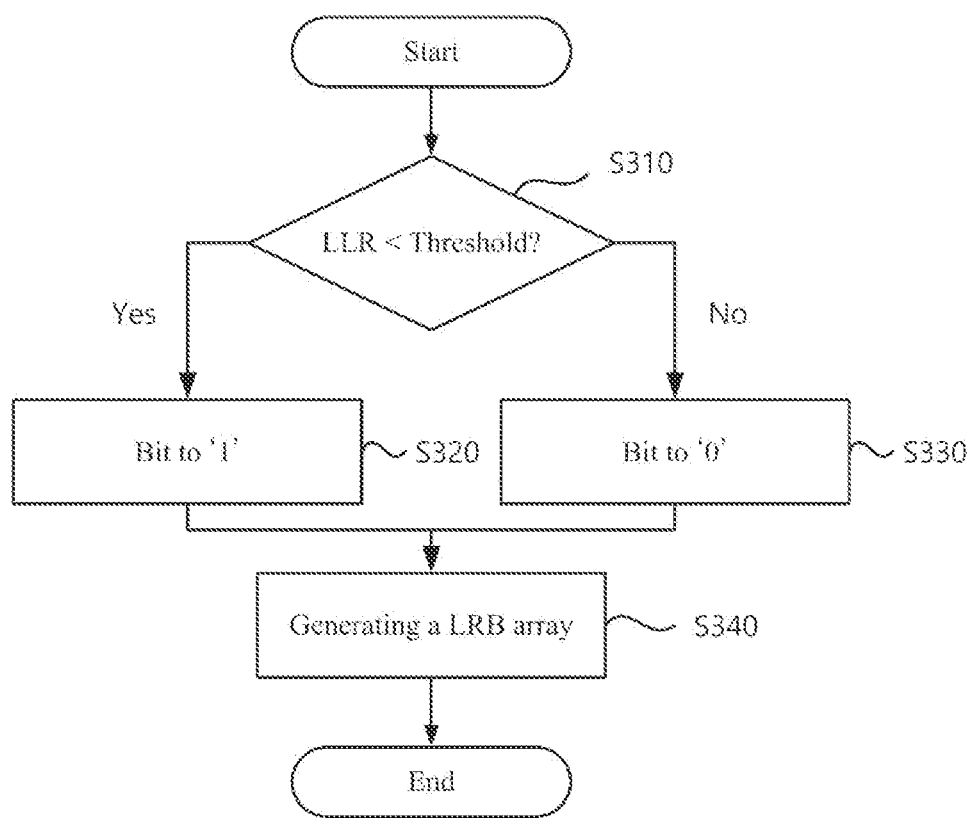
FIG. 12 is a flowchart illustrating a method of operating a threshold comparing unit included in an LRS search unit.JM

FIG. 12 is a flowchart illustrating a method of operating a threshold comparing unit included in an LRS search unit according to an embodiment.

Referring to FIG. 12, in operation S310, the threshold comparing unit 181 compares the LLR with a preset threshold value for each bit included in the flit.

When it is determined in operation S310 that the LLR is less than the preset threshold value, in operation S320, the threshold comparing unit 181 processes the corresponding bit as a logic of '1'.

When it is determined in operation S310 that the LLR is greater than or equal to the preset threshold value, in operation S330, the threshold comparing unit 181 processes the corresponding bit as a logic of '0'.

In operation S340, the threshold comparing unit 181 generates a LRB array based on the binarized bits.

As described above, the preset threshold value in operation S310 may be changed according to a control of the threshold control unit 185.

Figure 13:
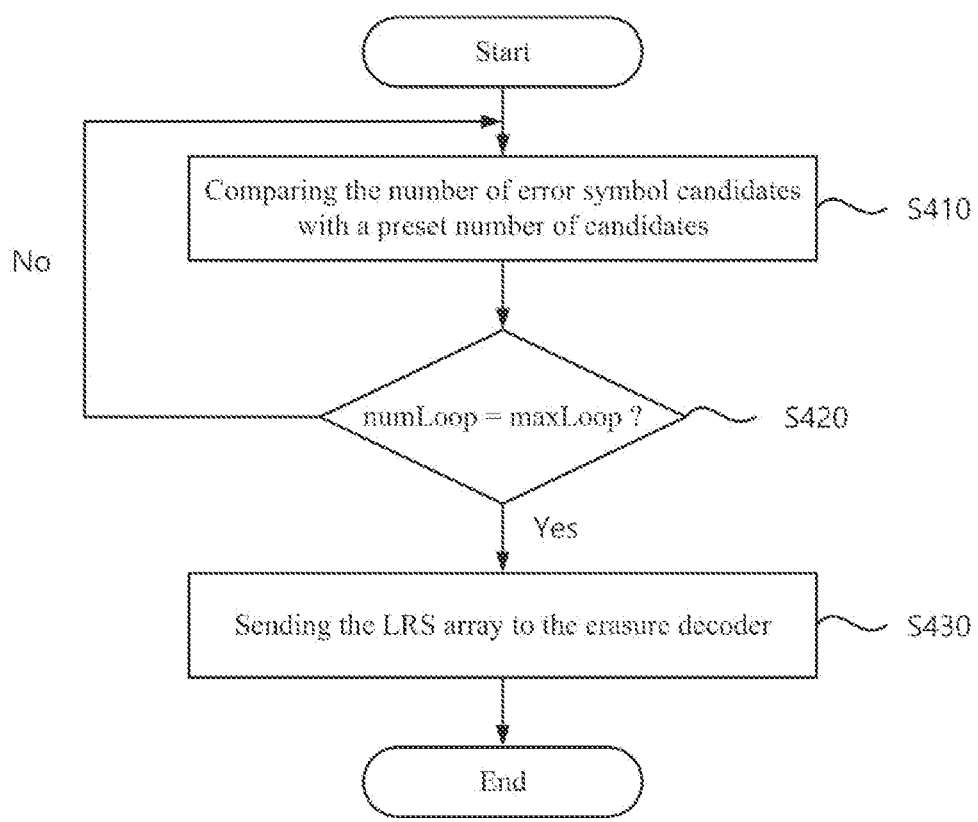
FIG. 13 is a flowchart illustrating a method of operating a comparing unit included in an LRS search unit.

FIG. 13 is a flowchart illustrating a method of operating a comparing unit included in an LRS search unit according to an embodiment.

Referring to FIG. 13, in operation S410, the comparing unit 184 compares the number 'numCand' of error symbol candidates with a preset number 'numErasure' of candidates.

In operation S420, the comparing unit 184 determines whether the number of loops is the same as the preset number 'maxLoop' of loops.

When it is determined that the number of loops is different from the preset number 'maxLoop' of loops according to operation S420, operation S410 is repeatedly performed.

When it is determined that the number of loops is the same as the preset number 'maxLoop' of loops according to operation S420, in operation S430, the comparing unit 184 sends the LRS array to the erasure decoder 190. When the number 'numCand' of error symbol candidates does not match the preset number 'numErasure' of candidates when the preset number 'maxLoop' of loops is reached, the comparing unit 184 sends the LRS array corresponding to the number 'numCand' of error symbol candidates to the erasure decoder 190.

According to the above-described erasure decoding unit 160 according to various embodiments of the present disclosure, the erasure decoding unit 160 may perform error correction at the ECC decoding stage, by extracting the error symbol candidates with high error probability through an LLR calculation for each bit included in the flit and by performing erasure decoding in consideration of the maximum number (two) of corrections for each ECC group of the RS code with respect to the corresponding error symbol candidate. Therefore, the erasure decoding unit 160 may minimize bandwidth degradation due to a retransmission request when CRC decoding fails.

Figure 14:
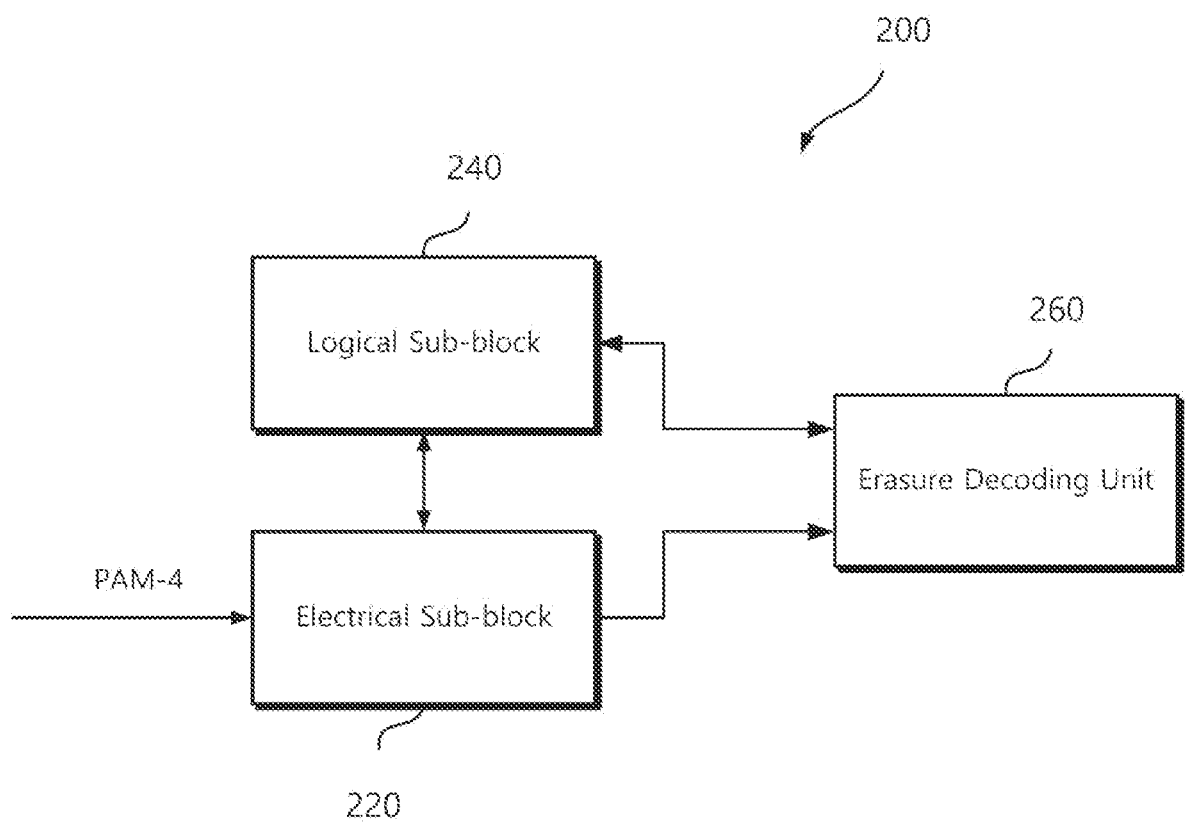
FIGS. 14 and 15 are diagrams illustrating an electronic device, according to an embodiment of the present disclosure.
Figure 15:
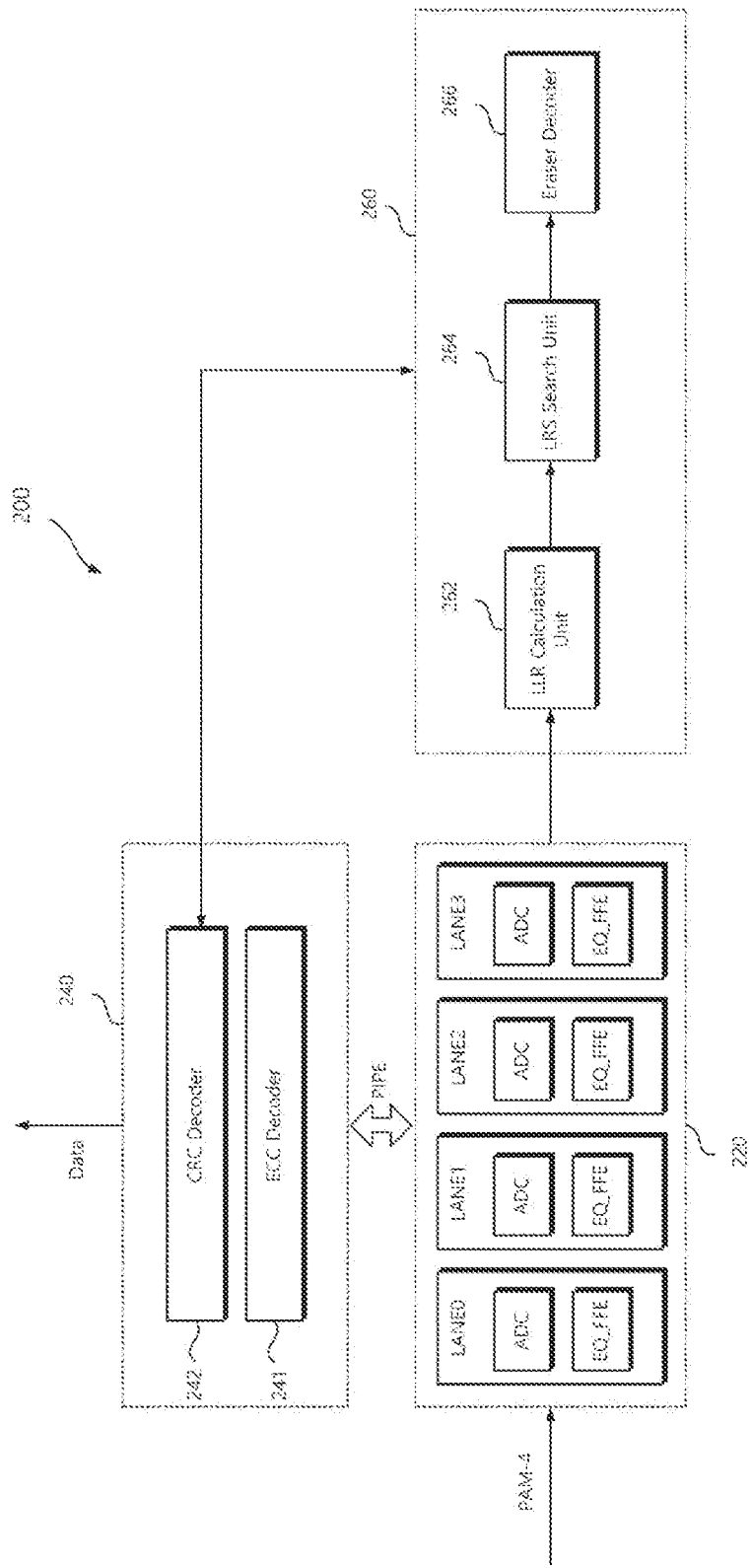

FIGS. 14 and 15 are diagrams illustrating an electronic device, according to an embodiment of the present disclosure.

Referring to FIG. 14, an electronic device 200 includes an electrical sub-block 220, a logical sub-block 240, and an erasure decoding unit 260.

The electrical sub-block 220 and the logical sub-block 240 may correspond to a lower layer of the physical layer included in the above-described PCIe layer. The electrical sub-block 220 generates a converted signal by performing an ADC and equalizing the PAM-4 signal received through a link for each of a plurality of lanes included in the link. The logical sub-block 240 receives the converted signal, converts it into a flit including a plurality of PAM-4 symbols, and performs ECC decoding and CRC decoding on the flit for each of a plurality of ECC groups. The erasure decoding unit 260 calculates the LLR for each PAM-4 symbol based on the converted signal when the CRC decoding by the logical sub-block 240 fails, extracts error symbol candidates from among PAM-4 symbols for each of the plurality of ECC groups based on the LLR, and performs the ECC decoding again after erasing the error symbol candidates.

Referring to FIG. 15, the electrical sub-block 220 according to an embodiment includes an ADC converter ADC and a feed forward equalizer EQ_FFE for each of a plurality of lanes. The electrical sub-block 220 receives the PAM-4 signal having 4-levels through a link (e.g., a link 1200 of FIG. 16), performs an analog-to-digital conversion through the ADC converter ADC and equalizing through the feed forward equalizer EQ_FFE for each of the plurality of lanes to generate the converted signal.

The electrical sub-block 220 is connected to the logical sub-block 240 through a pipe PIPE (e.g., a wire or bus), and transfers the converted signal to the logical sub-block 240. The pipe PIPE converts a signal transferred between the electrical sub-block 220 and the logical sub-block 240 through serialization or parallelization.

The logical sub-block 240 performs ECC decoding on the flit FLIT through an ECC decoder 241 and performs CRC decoding on the ECC decoded flit D_FLIT through a CRC decoder 242 to obtain data, but when the CRC decoding fails, the logical sub-block 240 notifies the erasure decoding unit 260 that the CRC decoding fails.

When notification that the CRC decoding fails is received from the logical sub-block 240, the erasure decoding unit 260 receives the converted signal from the electrical sub-block 220, calculates the LLR through an LLR calculation unit 262, generates the LRS through an LRS search unit 264, and performs erasure decoding through an erasure decoder 266 to generate a decoded signal. The erasure decoding unit 260 transfers the decoded signal to the CRC decoder 242 when erasure decoding is successful, and the CRC decoder 242 performs the CRC decoding again.

The CRC decoder 242 requests the transmission side to retransmit the flit when CRC decoding fails again.

Figure 16:
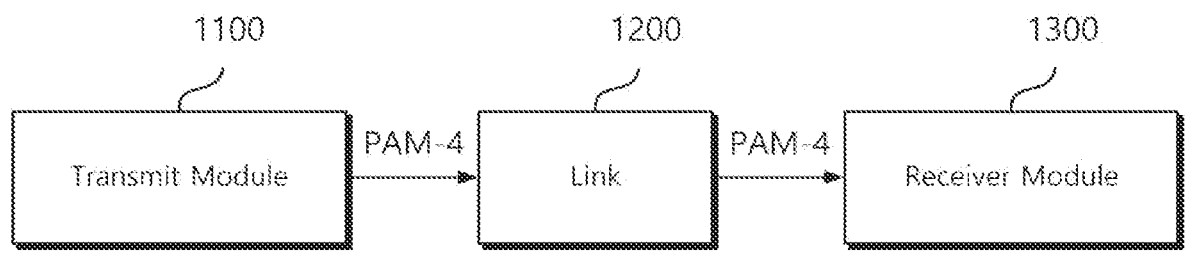
FIG. 16 is a diagram illustrating a transmitter and a receiver, according to an embodiment of the present disclosure.
Figure 17:
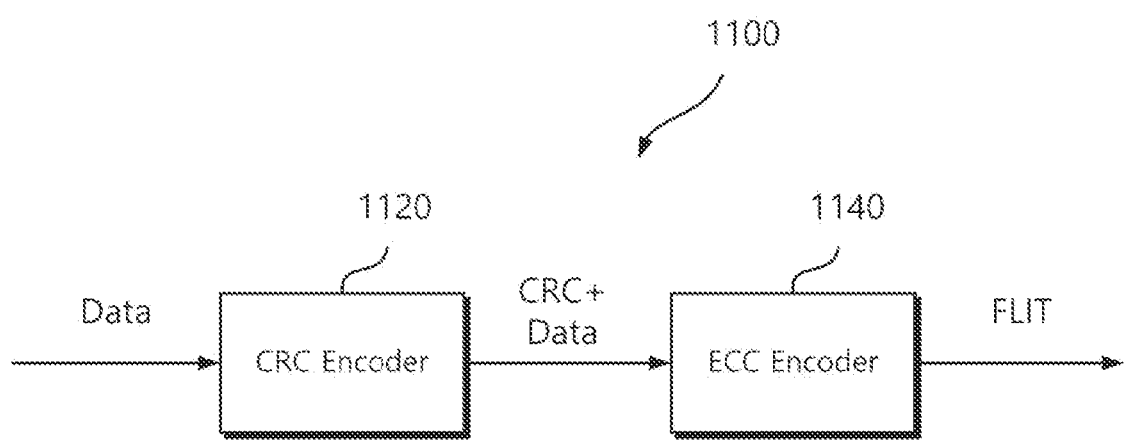
FIG. 17 is a detailed diagram of the transmitter of FIG. 16.

FIG. 16 is a diagram illustrating a transmit module and a receiver module, according to an embodiment of the present disclosure, and FIG. 17 is a detailed diagram of the transmit module of FIG. 16.

Refer to FIG. 16, a transmit module 1100 (e.g., a transmitter) generates the PAM-4 signal and transmits it to a receiver module 1300 (e.g., a receiver) through the link 1200, and the receiver module 1300 decodes the received PAM-4 signal to obtain data. The transmit module 1100 and the receiver module 1300 may correspond to the two components described above.

The transmit module 1100 may include a CRC encoder 1120 and an ECC encoder 1140 as illustrated in FIG. 17. The CRC encoder 1120 adds a CRC to the data by CRC encoding the data. The ECC encoder 1140 performs ECC encoding on CRC added data and adds an ECC to generate the flit. For example, the ECC encoder 1140 may perform an ECC encoding on the data plus the CRC to generate a codeword including redundancy information. The flit may then be converted into the PAM-4 signal and may be transmitted to the receiver module 1300. The receiver module 1300 may include, for example, the electronic devices 100 and 200 of FIGS. 5, 14 and 15, or may correspond to the electronic devices 100 and 200. The receiver module 1300 obtains data by ECC decoding and CRC decoding of the flit according to the above-described various embodiments, and when CRC decoding fails, the receiver module 1300 extracts one or more error symbol candidates to perform erasure decoding.

According to an embodiment of the present disclosure, the retransmission rate of a PCIe may be decreased.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device comprising:
an Error Correction Code (ECC) decoder configured to perform ECC decoding on a flit including a plurality of Pulse Amplitude Modulation-4 (PAM-4) symbols arranged into a plurality of groups to generate an ECC decoded flit for each of the groups;
a cyclic redundancy check (CRC) decoder configured to perform CRC decoding on each ECC decoded flit to obtain data; and
an erasure decoding unit,
wherein when the CRC decoding fails,
for each of the groups, the erasure decoding unit is configured to:
calculate a log likelihood ratio (LLR) for each of the PAM-4 symbols of the corresponding group, to extract an error symbol candidate from among the PAM-4 symbols of the corresponding group based on the LLR; and
erase the error symbol candidate from the corresponding group to update the flit, and
the electronic device is configured to perform the ECC decoding on the updated flit.

2. The electronic device of claim 1, wherein the erasure decoding unit comprises:
an LLR calculation unit configured to calculate the LLR for each of 2-bits included in each of the PAM-4 symbols;
a least reliable symbol (LRS) search unit configured to compare the LLR with a preset threshold value in units of bits, to extract the error symbol candidate, and to generate an LRS array corresponding to position information of the error symbol candidate; and
an erasure decoder configured to carry out the perform of the ECC decoding on the updated flit based on the LRS array.

3. The electronic device of claim 2, wherein the LRS search unit comprises:

a threshold comparing unit configured to generate a least reliable bit (LRB) array by binarizing a bit having the LLR less than the preset threshold value and a bit having the LLR greater than or equal to the preset threshold value in the flit; and a logic circuit configured to convert the LRB array into ECC symbol units using a logical OR operation to generate the LRS array.

4. The electronic device of claim 3, wherein the LRS search unit comprises:
an LRS counter configured to count the number of error symbol candidates from the LRS array;
a comparing unit configured to compare the number of error symbol candidates with a preset number of candidates, and configured to output the LRS array to the erasure decoder when the number of error symbol candidates is the same as the preset number of candidates; and
a threshold control unit configured to adjust the preset threshold value when the number of error symbol candidates is different from the preset number of candidates.

5. The electronic device of claim 4, wherein the threshold control unit increases the preset threshold value when the number of error symbol candidates is less than the preset number of candidates, and decreases the preset threshold value when the number of error symbol candidates exceeds the preset number of candidates.

6. The electronic device of claim 4, wherein the comparing unit iterates an operation of comparing the number of error symbol candidates with the preset number of candidates by a preset number of loops, and when the preset number of loops is reached, outputs an LRS array corresponding to the number of error symbol candidates when the number of error symbol candidates does not match the preset number of candidates.

7. The electronic device of claim 2, wherein the erasure decoder randomly extracts at least two error symbol candidates from among the error symbol candidates, and carries out the perform of the ECC decoding on the updated flit after erasing the at least two error symbol candidates.

8. The electronic device of claim 1, wherein the extract of the error symbol candidate extracts two or more error symbol candidates for at least one group among the plurality of groups.

9. The electronic device of claim 1, wherein the flit is interleaved with respect to the plurality of ECC groups.

10. The electronic device of claim 1, wherein the CRC decoder performs the CRC decoding on the updated flit and requests retransmission of the flit when the CRC decoding of the updated flit fails.

11. An electronic device comprising:
a first circuit configured to generate a converted signal by performing an analog-to-digital conversion (ADC) and equalizing a Pulse Amplitude Modulation-4 (PAM-4) signal received through a link;
a second circuit configured to convert the converted signal into a flit including a plurality of PAM-4 symbols arranged into a plurality of groups, and to perform Error Correction Code (ECC) decoding and cyclic redundancy check (CRC) decoding on the flit to generate an ECC decoded flit for each of the plurality of groups; and
an erasure decoding unit,
wherein when the CRC decoding fails,
for each of the groups, the erasure decoding unit is configured to:
calculate a log likelihood ratio (LLR) for each of the PAM-4 symbols of the corresponding group, to extract an error symbol candidate from among the PAM-4 symbols of the corresponding group based on the LLR, and
erase the error symbol candidate from the corresponding group to update the flit, and
the electronic device is configured to perform the ECC decoding on the updated flit.

12. The electronic device of claim 11, wherein the first circuit is configured to generate the converted signal for each of a plurality of lanes included in the link.

13. The electronic device of claim 11, wherein the second circuit comprises:
an ECC decoder configured to perform the ECC decoding on the flit; and
a CRC decoder configured to perform the CRC decoding on the ECC decoded flit to obtain data.

14. The electronic device of claim 11, wherein the erasure decoding unit comprises:
an LLR calculation unit configured to calculate the LLR for each of 2-bits included in each of the PAM-4 symbols from the converted signal;
a least reliable symbol (LRS) search unit configured to compare the LLR with a preset threshold value in units of bits, to extract the error symbol candidate, and to generate an LRS array corresponding to position information of the error symbol candidate; and
an erasure decoder configured to carry out the perform of the ECC decoding on the updated flit based on the LRS array.

15. The electronic device of claim 14, wherein the LRS search unit further comprises:
a threshold comparing unit configured to generate a least reliable bit (LRB) array by binarizing a bit having the LLR less than the preset threshold value and a bit having the LLR greater than or equal to the preset threshold value in the flit;
a logic circuit configured to convert the LRB array into ECC symbol units using a logical OR operation to generate the LRS array;
an LRS counter configured to count the number of error symbol candidates from the LRS array;
a comparing unit configured to compare the number of error symbol candidates with a preset number of candidates, and configured to output the LRS array to the erasure decoder when the number of error symbol candidates is the same as the preset number of candidates; and
a threshold control unit configured to adjust the preset threshold value when the number of error symbol candidates is different from the preset number of candidates.

16. The electronic device of claim 14, wherein the LRS array specifies a position of the error symbol candidate.

17. A method of operating an electronic device, the method comprising:
performing Error Correction Code (ECC) decoding on a flit including a plurality of Pulse Amplitude Modulation-4 (PAM-4) symbols arranged into a plurality of groups to generate an ECC decoded flit for each of the plurality groups;
performing cyclic redundancy check (CRC) decoding on the ECC decoded flit;
when the CRC decoding fails,
for each of the groups, calculating a log likelihood ratio (LLR) for each of the PAM-4 symbols of the corresponding group;

extracting an error symbol candidate from among the PAM-4 symbols of the corresponding group based on the LLR; and performing erasure decoding on the corresponding group based on the error symbol candidate to update the flit.

18. The method of claim 17, wherein the erasure decoding erases the error symbol candidate from the corresponding group to update the flit and performs the ECC decoding on the updated flit.

19. The method of claim 17, further comprising:

generating a least reliable bit (LRB) array by binarizing a bit having the LLR less than a preset threshold value and a bit having the LLR greater than or equal to the preset threshold value in the flit; and converting the LRB array into ECC symbol units to generate a least reliable symbol (LRS) array.

20. The method of claim 19, further comprising:

increasing the preset threshold value when the number of error symbol candidates is less than the preset number of candidates, and decreasing the preset threshold value when the number of error symbol candidates exceeds the preset number of candidates.

* * * * *